(12) United States Patent
Ohki et al.

(10) Patent No.: US 6,524,016 B1
(45) Date of Patent: Feb. 25, 2003

(54) SEMICONDUCTOR LASER MODULE

(75) Inventors: Yutaka Ohki, Ichihara (JP); Takeharu Yamaguchi, Yokohama (JP); Yuichiro Irie, Ichihara (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 8 days.

(21) Appl. No.: 09/667,825

(22) Filed: Sep. 22, 2000

(30) Foreign Application Priority Data

Sep. 24, 1999 (JP) .......................................... 11-270937

(51) Int. Cl.⁷ ................................................. G02B 6/36
(52) U.S. Cl. ............................. 385/88; 385/89; 385/90; 385/91; 385/92; 385/93
(58) Field of Search ............................ 385/88, 89, 90, 385/91, 92, 93; 372/42, 43

(56) References Cited

U.S. PATENT DOCUMENTS

| | | | |
|---|---|---|---|
| 5,561,675 A | * 10/1996 | Bayon et al. | 372/6 |
| 5,659,559 A | 8/1997 | Ventrudo et al. | |
| 5,993,073 A | * 11/1999 | Hamakawa et al. | 385/88 |
| 6,188,712 B1 | * 2/2001 | Jiang et al. | 372/96 |
| 6,282,340 B1 | * 8/2001 | Nasu et al. | 385/37 |

FOREIGN PATENT DOCUMENTS

| | | |
|---|---|---|
| EP | 0 611 097 | 8/1994 |
| EP | 0 798 830 | 10/1997 |
| EP | 0 860 917 | 8/1998 |
| JP | 10-293234 | 11/1998 |

OTHER PUBLICATIONS

P. A. Morton, et al., Applied Physics Letters, vol. 64, No. 20, pp. 2634–2636, XP–000449693, "Stable Single Mode Hybrid Laser With High Power and Narrow Linewidth", May 16, 1994.

J–F. Lemieux, et al., Electronics Letters, vol. 35, No. 11, pp. 904–905, XP–006012176, "Step–Tunable (100GHz) Hybrid Laser Based on Vernier Effect Between Fabry–Perot Cavity and Sampled Fibre Bragg Grating", May 27, 1999.

* cited by examiner

*Primary Examiner*—Hung Xuan Dang
*Assistant Examiner*—Tuyen Tra
(74) *Attorney, Agent, or Firm*—Oblon, Spivak, McClelland, Maier & Neustadt, P.C.

(57) ABSTRACT

A semiconductor laser module comprises a semiconductor laser having a front end facet from which output light is emitted, and an optical fiber on which the output light emitted from the semiconductor laser is incident, where the optical fiber has a light feedback portion for reflecting light at a predetermined wavelength. The semiconductor laser is accommodated in a package together with one end side of the optical fiber. The light feedback portion includes a first light feedback portion set at a predetermined reflection center wavelength for determining an oscillating wavelength of the semiconductor laser, and at least one second light feedback portion.

38 Claims, 10 Drawing Sheets

SEMICONDUCTOR LASER MODULE

BACKGROUND OF THE INVENTION

1. Field of the Invention

The present invention relates to a semiconductor laser module.

2. Description of the Related Art

In the field of optical communications, an optical transmission system in accordance with wavelength division multiplexing (WDM) scheme has been developed with intention of increasing the capacity of transmitted information, and its growth is accelerating particularly in North America which takes the initiative.

As an excitation light source for an optical fiber amplifier used in the WDM scheme, there is an increasingly higher demand for pumping semiconductor lasers in 1480 and 980 nm band. Particularly, for wavelength multiplexing in the 1480 nm band and for flatness of the gain profile in the 980 nm band, the need is increased for stabilizing the wavelength of emitted light from a semiconductor laser module using a fiber bragg grating (hereinafter simply called the "FBG").

The foregoing semiconductor laser module suffers from instability of a laser output in a semiconductor laser, for example, output light from the front or monitor light from the back, which causes a problem in controlling, for example, the output of an optical fiber amplifier. Particularly, the semiconductor laser module as described has a problem in that the stabilization of the wavelength using the FBG results in increasing the instability of the laser output.

SUMMARY OF THE INVENTION

It is an object of the present invention to provide a semiconductor laser module which is capable of stabilizing a laser output.

To achieve the above object, the present invention provides a semiconductor laser module comprising a semiconductor laser having a front end facet from which output light is emitted, an optical fiber, on which the output light emitted from the semiconductor laser is incident, having a light feedback portion for reflecting light at a predetermined wavelength, and a package for accommodating the semiconductor laser together with one end side of the optical fiber, wherein the light feedback portion includes a first light feedback portion set at a predetermined reflection center wavelength for determining an oscillating wavelength of the semiconductor laser, and at least one second light feedback portion.

Preferably, the second light feedback portion as used in the present invention has a reflectance equal to or lower than a maximum reflectance of the first light feedback portion at least within a wavelength range of a full width half maximum in the first light feedback portion.

Also preferably, the second light feedback portion has a reflection center wavelength substantially identical to that of the first light feedback portion.

Further preferably, a difference in the reflection center wavelength between the first light feedback portion and the second light feedback portion is set equal to or less than 0.5 nm.

Preferably, the first light feedback portion differs from the second light feedback portion in the reflection center wavelength.

Also preferably, the second light feedback portion has a flat reflection level characteristic substantially without wavelength dependence, and a reflectance lower than a maximum reflectance of the first light feedback portion.

Further preferably, either the first or the second light feedback portion comprises a fiber bragg grating.

Preferably, the first light feedback portion and an adjacent one of the second light feedback portions are spaced by a distance set equal to or longer than 5 mm between longitudinal center positions thereof.

Also preferably, two or more of light feedback portions chosen from the first light feedback portion and the at least one second light feedback portion comprise a chirped bragg grating having a reflection characteristic which is superposition of respective reflection characteristics.

Further preferably, the light feedback portion is positioned external to the package.

Preferably, the optical fiber includes polarization fluctuation preventing means disposed between the semiconductor laser and the light feedback portion for preventing fluctuations in light polarization.

Also preferably, the polarization fluctuation preventing means is a birefringent fiber.

Further preferably, the birefringent fiber is any of a PANDA fiber which has a core applied with a non-axially symmetric stress and a stress applying portion of circular cross-section; a bow-tie fiber having a fan-shaped cross-section; an elliptic jacket fiber of elliptic cross-section; and an elliptic core fiber having a core waveguide structure in a non-axially symmetric form and a core of elliptic cross-section.

Preferably, the distance from a rear end facet of the semiconductor laser to a longitudinal center position of either the first or the second light feedback portion is 10 cm or longer.

Also preferably, the semiconductor laser has an oscillating wavelength in a band centered at 980 nm.

Further preferably, the optical fiber is a lensed fiber, wherein light emitted from the semiconductor laser is coupled to a distal end of the lensed fiber.

Preferably, the lensed fiber is made by connecting by fusion the optical fiber formed with the first light feedback portion and/or the second light feedback portion.

According to these preferred aspects, it is possible to provide a semiconductor laser module which is capable of stabilizing a laser output.

The above and other objects, features and advantages of the present invention will become more apparent from the following detailed description based on the accompanying drawings.

BRIEF DESCRIPTION OF THE DRAWINGS

FIG. 4A shows the result of the measurement using an embodiment of the present invention which comprises a first light feedback portion and a second light feedback portion, and FIG. 4B is the result of the measurement using a comparative example which comprises only the first light feedback portion;

FIG. 12A shows the characteristic of the fourth embodiment using a PC connector as a second light feedback portion, and FIG. 12B shows the characteristic of a comparative example using an APC connector as a second light feedback portion.

DETAILED DESCRIPTION OF THE PREFERRED EMBODIMENTS

Figure 1A:
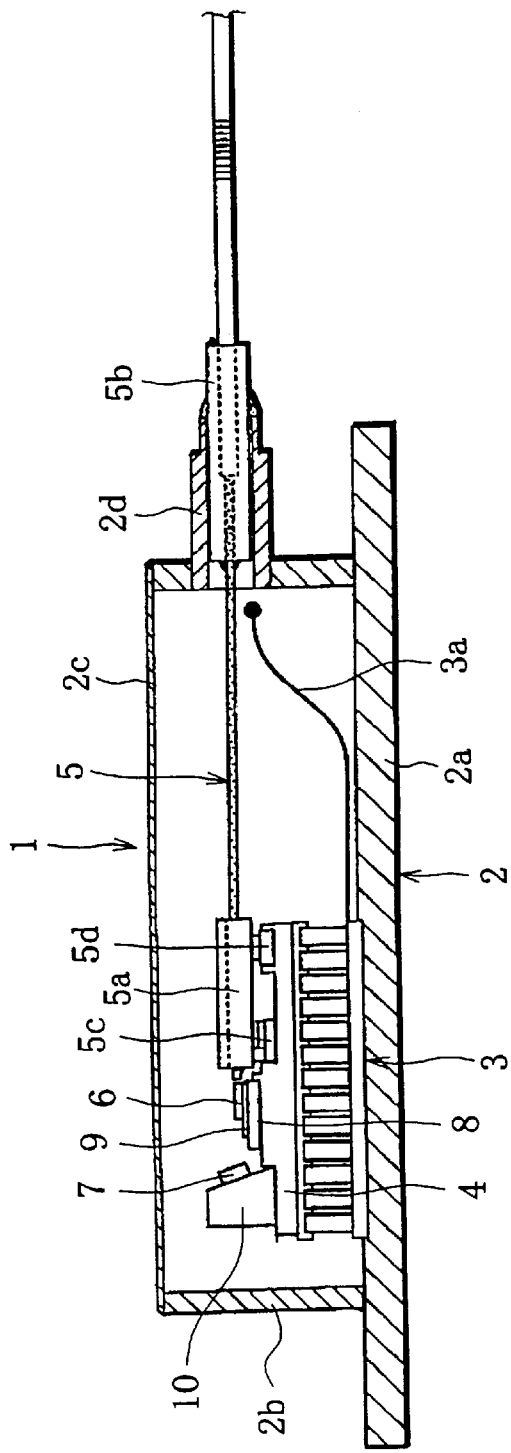
FIG. 1A is a cross-sectional elevation illustrating the general configuration of a semiconductor laser module according to a first embodiment of the present invention.

Embodiments of a semiconductor laser module according to the present invention will hereinafter be described with reference to FIGS. 1 through 12B.

It should be first noted that in respective embodiments described below, the same components are indicated with the same reference numerals so that repetitive description thereof is omitted.

Figure 1B:
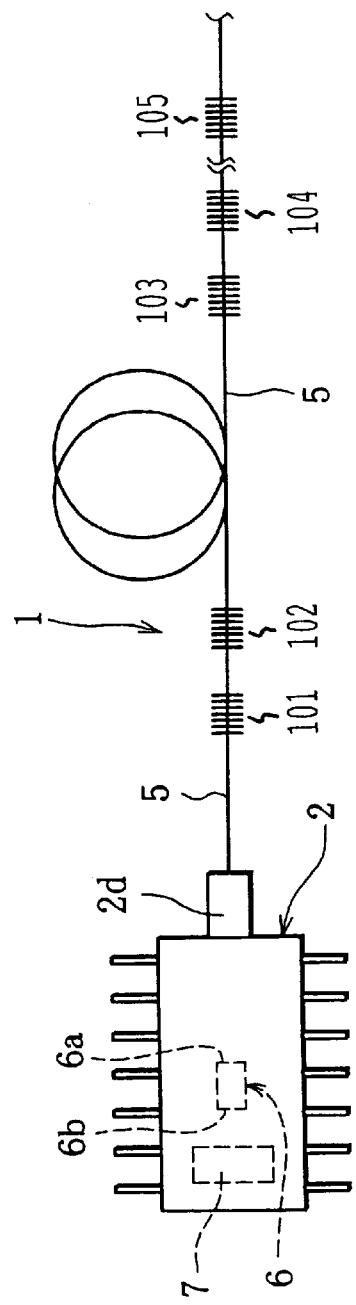
FIG. 1B is schematic diagram illustrating the general configuration of an optical transmission system comprising the semiconductor laser module and a plurality of FBGs formed in an optical fiber.
Figure 2A:
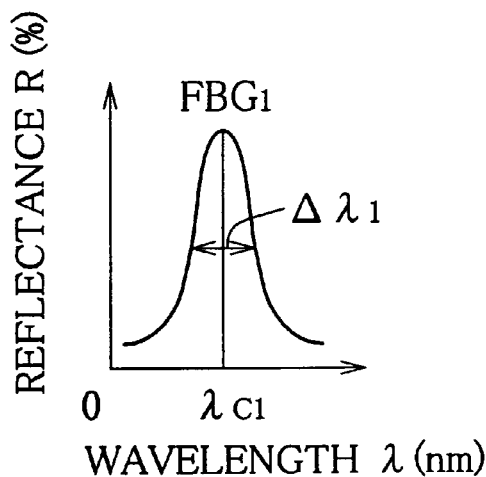
FIGS. 2A through 2D are exemplary characteristic graphs showing the wavelength dependence of a reflection level for a plurality of FBG1 to FBGn formed in the optical fiber for use with the semiconductor laser module of FIGS. 1A and 1B, where the horizontal axis represents the wavelength, and the vertical axis represents the reflectance.
Figure 2B:
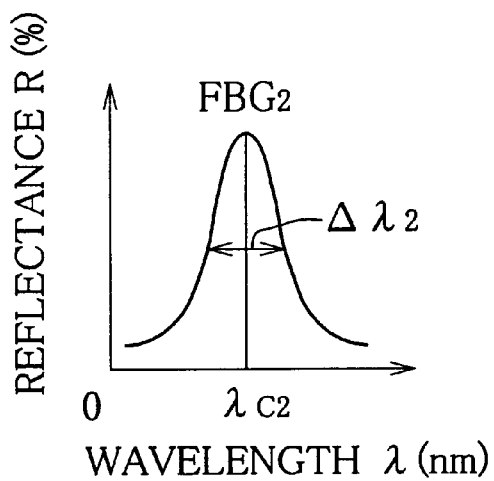
Figure 2C:
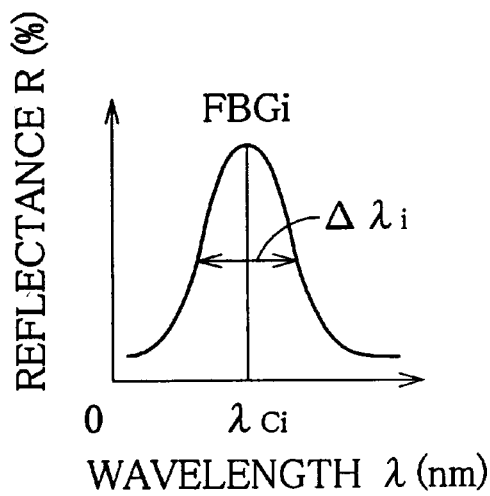
Figure 2D:
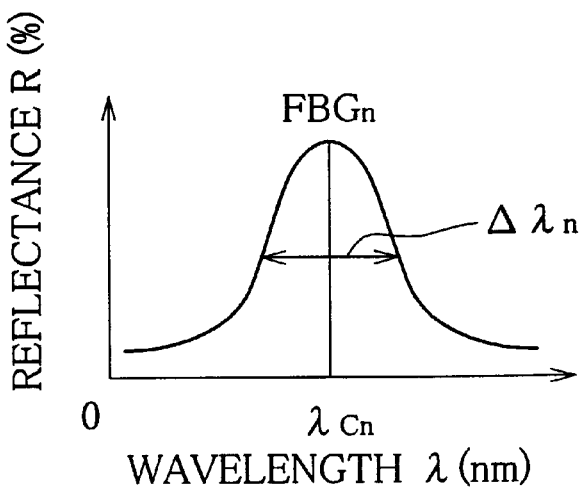
Figure 3A:
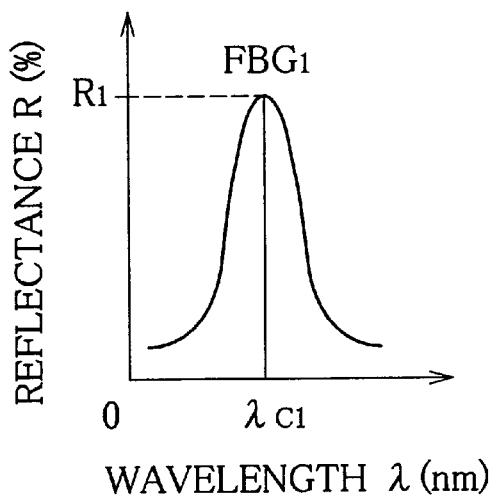
FIGS. 3A through 3D are other exemplary characteristic graphs showing the wavelength dependence of a reflection level for a plurality of FBG1 to FBGn formed in the optical fiber for use with the semiconductor laser module of FIGS. 1A and 1B, where the horizontal axis represents the wavelength, and the vertical axis represents the reflectance.
Figure 3B:
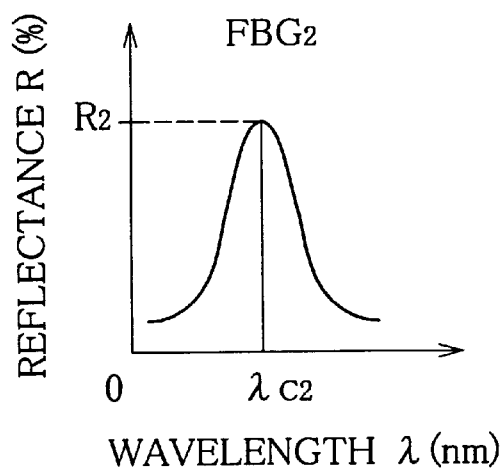
Figure 3C:
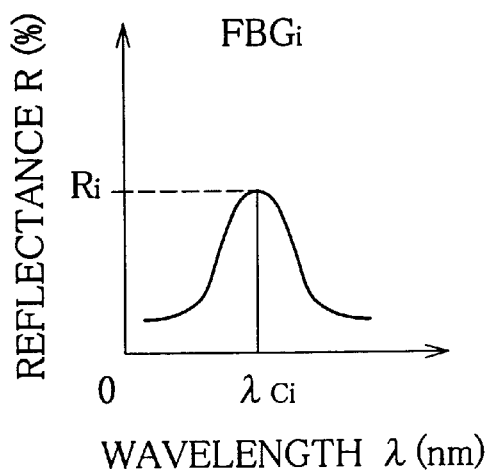
Figure 3D:
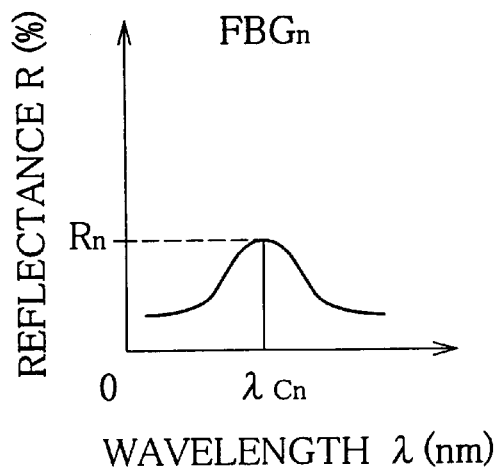

First, a semiconductor laser module 1 according to a first embodiment, as illustrated in FIGS. 1A and 1B, comprises a package 2, a Peltier element 3, a base 4, an optical fiber 5, a semiconductor laser 6, and a photodiode 7.

The package 2 accommodates the Peltier element 3, the base 4, one end side of the optical fiber 5, the semiconductor laser 6, the photodiode 7, and so on. The package 2 has a bottom plate 2a, a peripheral wall 2b, and a cover 2c, and the cover 2c is attached on the peripheral wall 2b. The package 2 is also provided with a sleeve 2d extending from the peripheral wall 2b. A second ferrule 5b, later described, of the optical fiber 5 is inserted into the sleeve 2d. The package 2 is filled with a nitrogen gas, for example, to have an inert gas atmosphere in the interior.

The Peltier element 3 is disposed on the bottom plate 2a, and serves as a temperature control element for dissipating heat resulting from the driving of the semiconductor laser 6 to regulate the semiconductor laser module 1 at a predetermined temperature. The base 4 is carried on the Peltier element 3. The Peltier element 3 is supplied with a driving current through a lead line 3a from the outside of the package 2.

As illustrated in FIGS. 1A and 1B, the base 4 carries the semiconductor laser 6 through a first carrier 8 and a heat sink 9. Also, disposed on the base 4 are a second carrier 10 near a rear end facet 6b of the semiconductor laser 6, and a first ferrule 5a attached to one end of the optical fiber 5 near a front end facet 6a of the semiconductor laser 6.

For the optical fiber 5, a variety of optical fibers may be used in addition to a single mode fiber, and a lensed fiber is connected to the optical fiber which forms an FBG by fusion. The lensed fiber is formed with a wedge-shaped lens at one end as a light coupling means which is positioned opposite to the semiconductor laser 6. Also, on the other end side of the optical fiber 5, the first ferrule 5a and the second ferrule 5b are attached. The optical fiber 5 extends external to the package 2 from the sleeve 2d through the second ferrule 5b. The first ferrule 5a is disposed on the base 4 by supporting parts 5c, 5d.

As illustrated in FIG. 1B, the optical fiber 5 is further formed with FBG1 101, FBG2 102, . . . , FBGi 103, FBGi 104 . . . , FBGn 105 which function as a first or a second light feedback portion. The FBG1 101 to FBGn 105 may be arranged in any order, and may have whichever magnitudes of the full width half maximum.

Here, the FBG1 101 functions as the first light feedback portion of the present invention, while the remaining FBG2 102 to FBGn 105 respectively function as second light feedback portions. The first light feedback portion (FBG1 101) is set at a predetermined reflection center wavelength which determines the oscillating wavelength of the semiconductor laser 6. The second light feedback portions (FBG2 102 to FBGn 105), on the other hand, are components for stabilizing the laser output, and may be one or plural.

The semiconductor laser module 1 of the first embodiment has the FBG1 101 to FBGn 105 positioned external to the package 2. This is because the expensive FBG1 101 to FBGn 105 may be removed when the semiconductor laser module 1 gets into a characteristic failure, so that the FBG1 101 to FBGn 105 may be used for another module.

For a semiconductor laser module for use in a wavelength band centered at 980 nm, the semiconductor laser 6 is optically coupled to the lensed fiber within the package 2. Since it is difficult to incorporate the lensed fiber and the FBG1 101 to FBGn 105 in the optical fiber, the lensed fibers and the FBG1 101 to FBGn 105 are separately fabricated using different optical fibers, respectively, and are connected by fusion to one another to form a single optical fiber.

Now, FIGS. 2A through 2D show exemplary reflection characteristics of the FBG1 101, FBG2 102, FBGi 103, FBGn 105, for example, where the vertical axis represents the reflectance R (%), and the horizontal axis represents the wavelength $\lambda$ (nm). In this case, in the semiconductor laser module I of the first embodiment, the FBG1 101 to FBGn 105 have reflection center wavelengths $\lambda c1$ to $\lambda cn$ substantially identical to each other (for example, a difference in wavelength is within 2 nm).

More specifically, assuming that the FBG1 101 to FBGn 105 are substantially identical in their reflection center wavelengths $\lambda c1$ to $\lambda cn$ (for example, a difference in wavelength is within 2 nm), and the first FBG1 101 nearest from the semiconductor laser 6 has a full width half maximum $\Delta\lambda 1$, the second nearest FBG2 102 has a full width half maximum $\Delta\lambda 2, \ldots$, the i-th nearest FBGi 103 has a full width half maximum $\Delta\lambda i, \ldots$, and the n-th nearest FBGn 105 has a full width half maximum $\Delta\lambda n$, the FBG1 101 to FBGn 105 are set such that a relationship $\Delta\lambda 1 \leq \Delta\lambda 2 \leq \ldots \leq \Delta\lambda i \leq \ldots \leq \Delta\lambda n$ is satisfied simultaneously.

At this time, the difference in the reflection center wavelength between the respective FBG1 101 to FBGn 105 is preferably within 2 nm, more preferably within 0.5 nm, and further preferably within 0.2 nm. The reflection center wavelengths set in this way are preferred since the semiconductor laser can be stably oscillated at a desired wavelength.

It is also desirable to use the FBG2 102 to FBGn 105 which have reflectances equal to or lower than a maximum reflectance of the FBG1 101 at least within the wavelength of the full width half maximum in th FBG1 101.

Further, as another implementation, the FBG1 101 to FBGn 105 may be selected such that their respective reflection center wavelengths $\lambda c1$ to $\lambda cn$ are identical, and $R1 \geq R2 \geq \ldots \geq Ri \geq \ldots \geq Rn$ is satisfied simultaneously, where R1 is a maximum reflectance of the first FBG1 101 nearest from the semiconductor laser 6; R2 is a maximum reflectance of the second nearest FBG2 102, . . . , Ri is a maximum reflectance of the i-th nearest FBGi 103, . . . , and Rn is a maximum reflectance of the nth nearest FBGn 105, as shown in FIGS. 3A through 3D, where the vertical axis represents the reflectance R (%), and the horizontal axis represents the wavelength $\lambda$ (nm).

The semiconductor laser 6 emits, for example, laser light in a wavelength band centered at 980 nm into the optical fiber 5 from the front end facet 6a, and monitor light toward the photodiode 7 from the rear end facet 6b. At this time, the semiconductor laser 6 is positioned with respect to the first ferrule 5a so as to minimize, for example, a difference between an active layer and the optical axis of the optical fiber 5 in the height direction preferably within several $\mu$m. At this time, the first ferrule 5a is positioned to substantially maximize the light emitted from the semiconductor laser 6 and a light coupling efficiency.

The photodiode 7 is disposed on the second carrier 10 with its light receiving surface inclined as illustrated in FIG. 1A, and functions as a monitor for receiving the monitor light emitted from the rear end facet 6b of the semiconductor laser 6. Here, since the light emitted from the front end facet may be branched for monitoring, the photodiode 7 is not an essential component for the semiconductor laser module 1.

The semiconductor laser module 1 of the first embodiment, configured as described above, will now be described below for its operation.

First, light emitted from the semiconductor laser 6 enters the optical fiber 5, and is fed back toward the originating semiconductor laser 6 by the FBG1 101 to FBGn 105. By repeating this feedback operation, the semiconductor laser 6 oscillates the laser at the reflection center wavelength $\lambda c1$ of the FBG1 101. This laser oscillation causes the semiconductor laser 6 to emit laser light from the front end facet 6a as output light and laser light from the rear end facet 6b as monitor light, respectively.

At this time, since the light feedback from the FBG1 101 to FBGn 105, located at different distances from the semiconductor laser 6, reduces the coherency in the oscillating state of the semiconductor laser 6, the laser output is stabilized, and a monitor current is also stabilized in the photodiode 7.

Figure 4A:
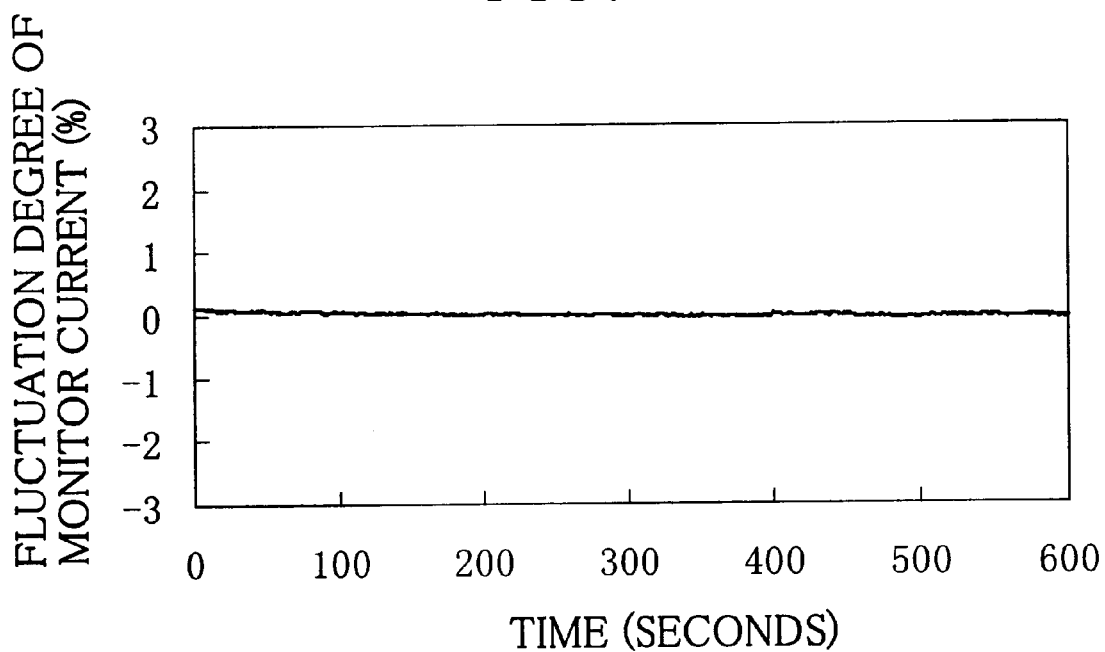
FIGS. 4A and 4B are graphs showing the results of measuring a change in a fluctuation degree of a monitor current over time, with the horizontal axis representing the time, and the vertical axis representing the fluctuation degree of the monitor current, where
Figure 4B:
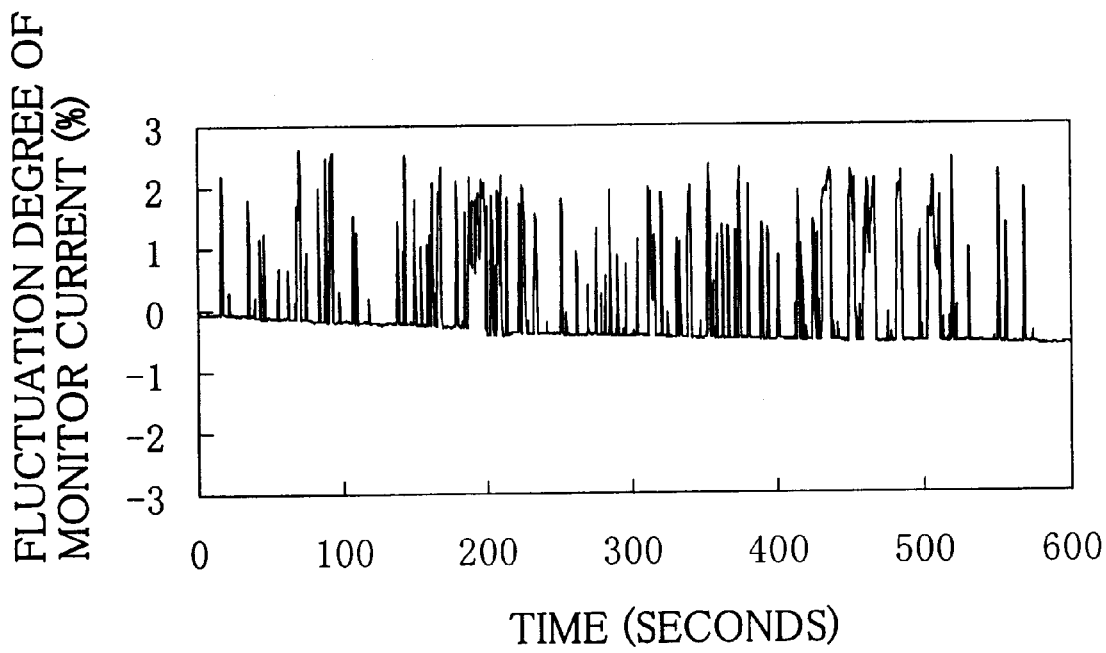

FIGS. 4A and 4B show graphs of the fluctuation degree (%) of the monitor current on the vertical axis versus the time (seconds) on the horizontal axis for the semiconductor laser module 1. Here, the fluctuation degree of the monitor current is defined as a deviation from an average value of the monitor current measured for 600 seconds (0% of fluctuation degree).

FIG. 4A shows the result which is obtained in the first embodiment when the first light feedback portion is implemented by the single FBG1 101 which exhibits the reflection center wavelength at 979 nm, the reflectance of 7%, and the full width half maximum equal to 1 nm, and the second light feedback portion is implemented by the FBG2 102 which exhibits the reflection center wavelength at 979 mn, the reflectance of 2%, and the full width half maximum equal to 2 nm (i.e., the second light feedback portion comprises only one FBG in this example). FIG. 4B, on the other hand, shows the result which is obtained as a comparative example of the first embodiment in which a single light feedback portion is implemented by a single FBG which exhibits the reflection center wavelength at 979 nm, the reflectance of 12%, and the full width half maxim equal to 1.5 nm.

It can be seen that FIG. 4B shows large variations in the fluctuation degree of the monitor current, whereas FIG. 4A shows small variations in the fluctuation degree of the monitor current and hence a stable fluctuation degree. It is confirmed from the results shown in FIGS. 4A and 4B that the semiconductor laser module 1 configured in accordance with the first embodiment can stabilize the laser output of the semiconductor laser 6.

Figure 5:
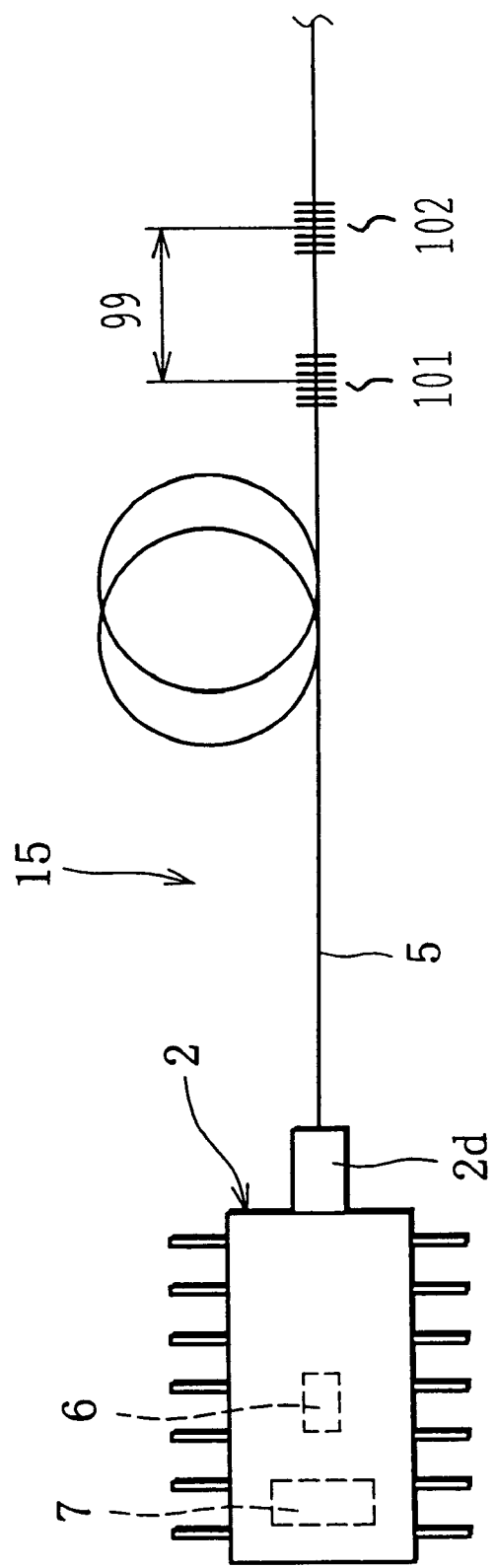
FIG. 5 is a schematic diagram illustrating the general configuration of a modification to the semiconductor laser module according to the first embodiment of the present invention.

On the other hand, assuming that a single second light feedback portion is provided for simplicity, the FBG1 101 functioning as the first light feedback portion and FBG2 102 functioning as the second light feedback portion are located next to each other at a distance L 99 ($\geq$5 mm) in the optical fiber 5, as a semiconductor laser module 15 illustrated in FIG. 5.

The semiconductor laser module 15 provided with two light feedback portions in the overall module configuration generates fluctuations in the reflectance, in a reflection waveform, of a magnitude substantially equal to a wavelength interval $\lambda^2/2$ nL 99 which is determined by the oscillating wavelength k and the refractive index n of the optical fiber. Then, in the semiconductor laser module 15, as the distance L 99 is too short, the wavelength interval becomes too long, resulting in a less number of times a large reflectance appears in the reflection characteristic, formed near the center wavelength of the first light feedback portion.

It is therefore estimated that the semiconductor laser module 15 will suffer from an instable oscillating state. To avoid such a situation, preferably, the distance L 99 should be set equal to or longer than 5 mm, in which case, the semiconductor laser module 15 can effectively reduce the coherency in the oscillating state of the semiconductor laser 6 to stabilize the laser output.

Next, a second embodiment of the present invention will be described with reference to FIGS. 6A through 8D.

Figure 6:
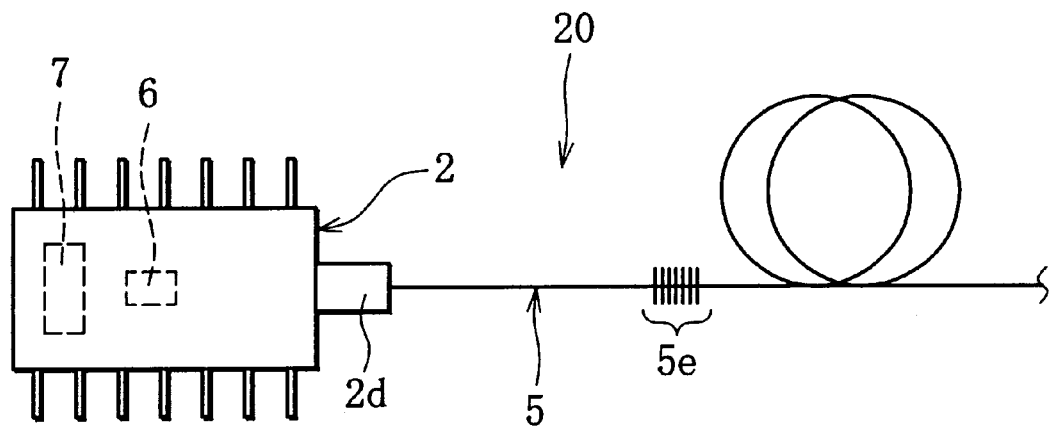
FIG. 6 is a schematic diagram generally illustrating a semiconductor laser module and a light feedback portion formed in an optical fiber according to a second embodiment of the present invention.
Figure 7:
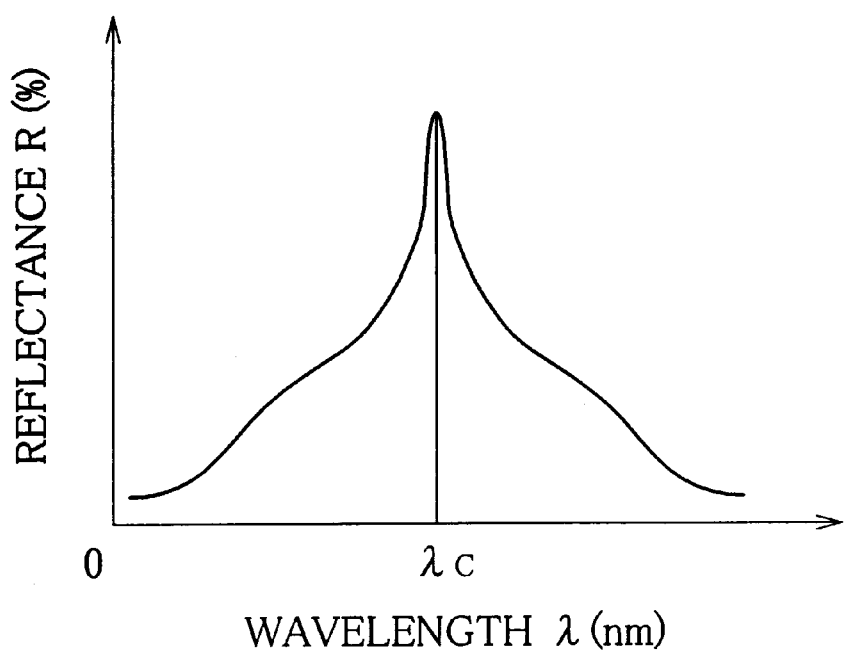
FIG. 7 is a characteristic graph showing the wavelength dependence of a reflection level for an FBG formed in the optical fiber in FIG. 6, wherein the horizontal axis represents the wavelength, and the vertical axis represent the reflectance.
Figure 8A:
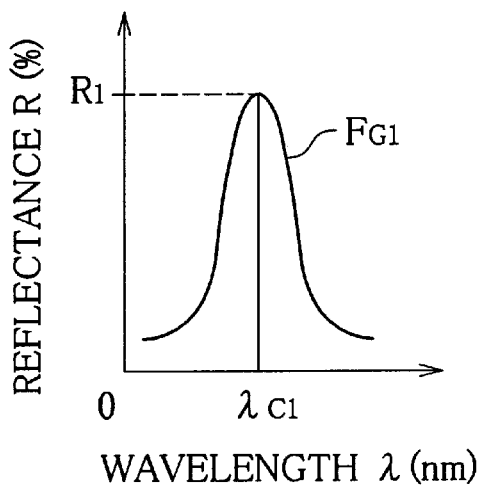
FIGS. 8A through 8D are characteristic graphs each showing the wavelength dependence of a reflection level, representing each of a plurality of Gaussian functions forming the wavelength characteristics exhibited by the FBG of FIG. 6 in a relation between the reflectance and the wavelength.
Figure 8B:
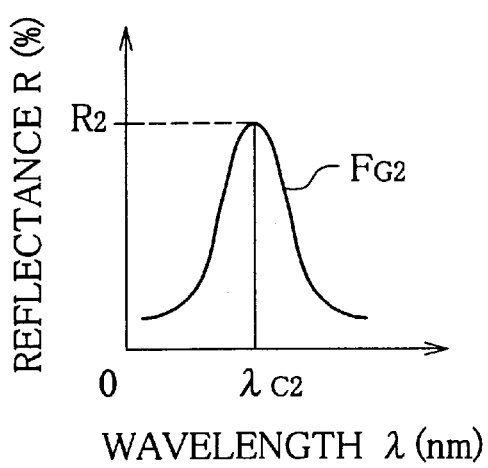
Figure 8C:
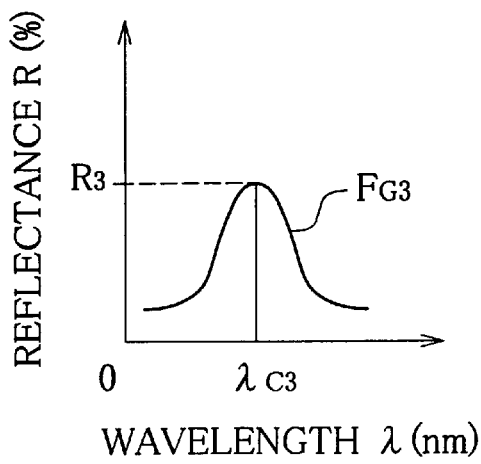
Figure 8D:
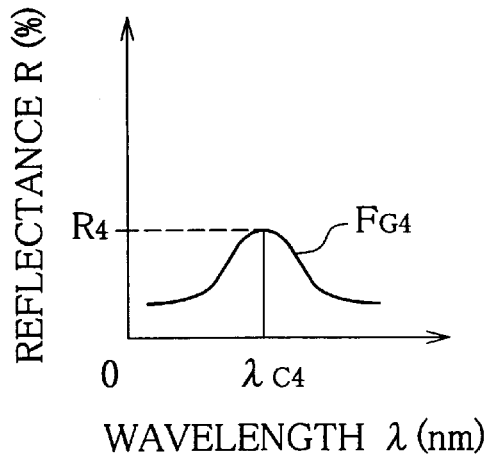

A semiconductor laser module 20 comprises an FBG 5e formed in the middle of an optical fiber 5, which functions as a light feedback portion, as illustrated in FIG. 6. It is formed as a chirped grating having the overall reflection characteristic shown in FIG. 7, which is a combination of the reflection characteristics of a first light feedback portion and a second light feedback portion, where the vertical axis represents the reflectance R (%), and the horizontal axis represents the wavelength λ (nm).

The used FBG 5e is implemented by a chirped grating which has the reflection characteristic represented by superposition of a plurality of Gaussian functions exhibiting the reflection characteristics of the first light feedback portion and the second light feedback portion, for example, four Gaussian functions FG1, FG2, FG3, FG4 which have reflection center wavelengths λc1 to λc4 equal to one another (λc1=λc2=λc3=λc4) and maximum reflectances R1, R2, R3, R4, respectively, as shown in FIGS. 8A to 8D. The cycle of variations in reflectance changes in the direction of the optical axis of the optical axis 5.

The chirped grating may be formed to have a reflection wavelength characteristic by combining arbitrary light feedback portions with one another.

As described above, the semiconductor laser module 20 can also reduce the coherency in the oscillating state of the semiconductor laser 6 and stabilize the monitor current, when it employs the optical fiber 5 which has the FBG 5e formed as a chirped grating having superposition of reflection characteristics of a plurality of FBGs.

In this way, although the semiconductor laser module of the present invention basically comprises a first light feedback portion and a second light feedback portion, the semiconductor laser module may employ a single light feedback portion having superposition of respective reflection characteristics of a plurality of such light feedback portions.

Next, a third embodiment of the present invention will be described with reference to FIGS. 1B and 9.

A semiconductor laser module of the third embodiment is characterized in that the FBG1 101 functioning as the first light feedback portion of he optical fiber 5 differs from the second light feedback portions FBG2 102, . . . , FBGn 105 in the reflection center wavelength and the reflection level at the reflection center wavelength in the semiconductor laser module 1 illustrated in FIG. 1B.

Figure 9:
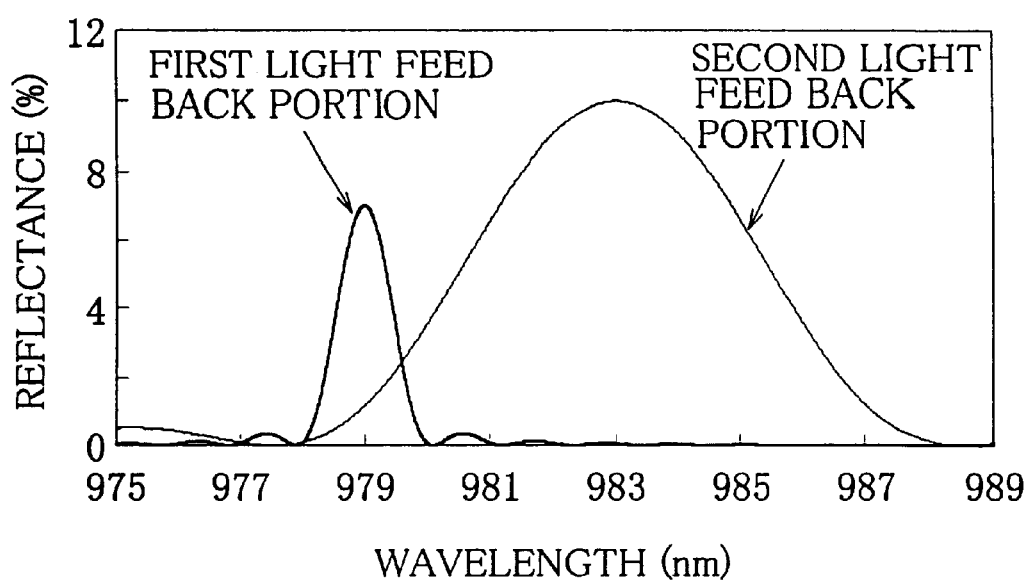
FIG. 9 is a characteristic graph showing the wavelength dependence of a reflection level for FBGs which function as first and second light feedback portions formed in a semiconductor laser module according to a third embodiment of the present invention, where the horizontal axis represents the wavelength, and the vertical axis represents the reflectance.

FIG. 9 shows an example of a reflectance (%) distribution for the first light feedback portion and the second light feedback portion of the optical fiber 5.

As shown in FIG. 9, the FBG1 101 functioning as the first light feedback portion exhibits the reflection center wavelength at 979 nm, the reflectance R of 7%, and the full width half maximum equal to 1 nm. The FBG2 102 functioning as the second light feedback portion exhibits the reflection center wavelength at 983 nm, the reflectance R of 10%, and the full width half maxim equal to 5 nm. The second light feedback portion (FBG2 102) has the reflectance at the reflection center wavelength larger than the reflectance at the reflection center frequency of the first light feedback portion (FBG1 101). However, the second light feedback portion (FBG2 102) has the reflection characteristic which exhibits a smaller reflectance than a maximum reflectance of the first light feedback portion in wavelength range of the full width half maximum in the first light feedback portion (FBG1 101).

Generally, the relationship between a loss and a gain dominates whether the semiconductor laser 6 oscillates with light from the first light feedback portion (FBG1) or the second light feedback portion (FBG2). Therefore, the semiconductor laser module 1 employs the semiconductor laser 6 which has an appropriate shape of the gain with respect to the wavelength.

Specifically, assuming that g represents a gain factor of an active layer in the semiconductor laser 6, and Γ represents a light confinement factor of the same, the effective gain in the waveguide structure of the semiconductor laser 6 can be represented by Γg.

Assume herein that a cavity length of the semiconductor laser 6 is Lre, a loss in he semiconductor laser due to scattering or the like is $\alpha_{in}$, and an amplitude reflection ratio on the rear end face 6b of the semiconductor laser 6 is $r_b$. Assume also that an effective reflectance (generally in the form of complex number) in an emitting direction calculated from the reflectance on the front end facet of the semiconductor laser 6, a power coupling efficiency between the semiconductor laser 6 and the optical fiber 5, the reflectances of the FBG1 101 to FBGn 105, and so on is $r_f$.

Then, a mirror loss $\alpha_m$ can be represented by:

$$\alpha_m = (1/Lre)\ln(1/r_b|r_f|) \quad \ldots (1)$$

Using these parameters, a laser oscillating threshold condition for an electric field amplitude can be represented by:

$$\Gamma g(\lambda) = \alpha_{in} + \alpha_m(\lambda) \quad \ldots (2)$$

on condition that the loss is balanced with the gain. The parenthesized λ represents that the laser oscillating threshold condition exhibits the wavelength dependence.

Also, the laser oscillating condition for the phase can be represented, using the refractive index n1 of the active layer, by:

$$4\pi n1 Lre/\lambda - 2m\pi = \arg(r_f) \quad \ldots (3)$$

where m is an integer.

Generally, the oscillating wavelength of the semiconductor laser 6 is determined by equations (2) and (3). Representing equation (2) in a graph, the left side protrudes upward, while the right side protrudes downward. Therefore, when the wavelength dependences on both sides are drawn in a graph, their intersection can determine the oscillating wavelength of the semiconductor laser 6.

It will be appreciate from the foregoing that the semiconductor laser 6 and he FBG may be selected such that the wavelength dependence n the right side of equation (2) determined by the FGB1 101 to FBGn 105 has an intersection with the wavelength dependence of the left side of equation (2) determined by the characteristic of the semiconductor laser 6 only at the first light feedback portion (FBG1 101).

As described above, by appropriately selecting the semiconductor laser 6 and the FBG1 101 to FBGn 105, it is possible to oscillate only at the center wavelength of the first light feedback portion even if the second light feedback portion (FBG2 102) has a higher reflectance at the reflection center wavelength than the first light feedback portion (FBG1 101), as shown in FIG. 9.

Also, as shown in FIG. 9, the second light feedback portion reflects at the reflection center wavelength of the first light feedback portion (FBG 1101), though its reflectance is lower than that of the first light feedback portion (FBG1 101). The light feedback from the second light feedback portion (FBG2 102) enables the semiconductor laser module 1 of the third embodiment to reduce the coherency of the laser oscillation in the semiconductor laser 6 and stabilize the monitor current.

Next, a fourth embodiment of present invention will be described with reference to FIGS. 10 through 12B.

Figure 10:
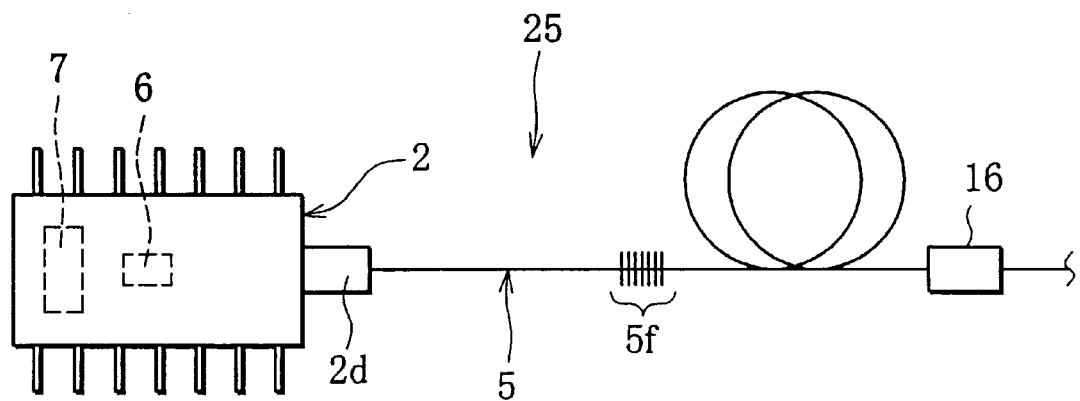
FIG. 10 is a schematic diagram illustrating the general configuration of a semiconductor laser module and a light feedback portion formed in an optical fiber according to a fourth embodiment of the present invention.
Figure 11:
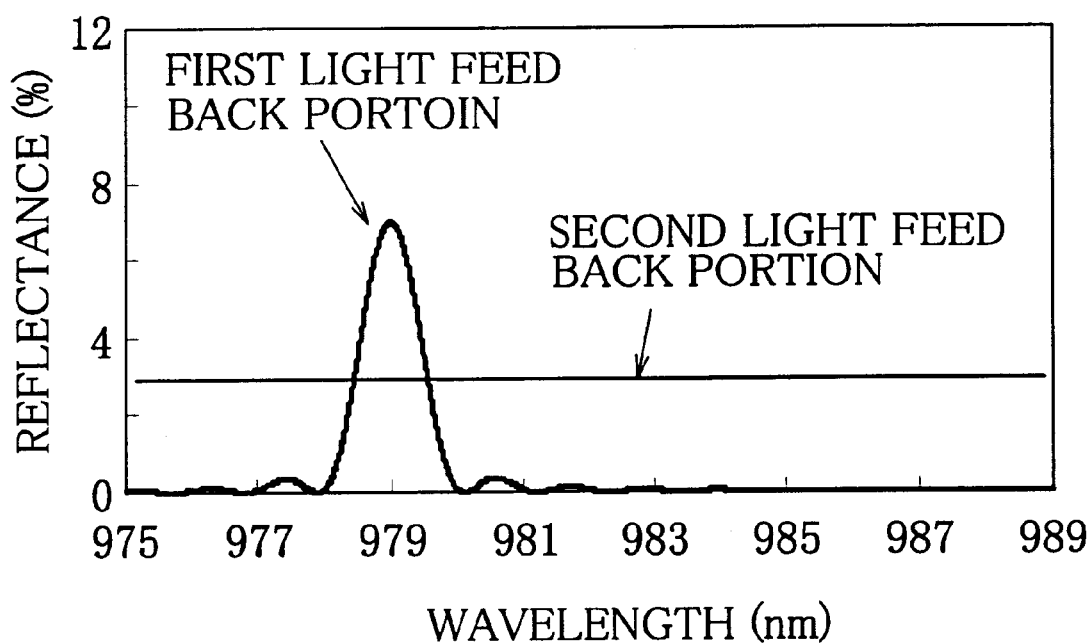
FIG. 11 is a characteristic graph showing the wavelength dependence of a reflection level for FBGs which function as first and second light feedback portions formed in a semiconductor laser module, where the horizontal axis represents the wavelength, and the vertical axis represents the reflectance.

A semiconductor laser module 25 of the fourth embodiment employs an FBG 5f, for example, as a first light feedback portion, and employs a light feedback portion 16, which has a flat reflectance characteristic substantially without the wavelength dependence, and a reflectance lower than a maximum reflectance of the first light feedback portion, as a second light feedback portion, as shown in FIG. 10. FIG. 11 shows distributions of the reflectances (%) of the FBG 5f which functions as the first light feedback portion and the light feedback portion 16 which functions as the second light feedback portion.

The light feedback portion 16 as shown can be implemented, for example, by a dielectric multi-layer coating, FBG, any other optical filter which has a flat reflection level characteristic within a wide wavelength band including the reflection center wavelength of the FBG 5f, or an emitting end face of an optical fiber which is set at a predetermined reflectance.

In the fourth embodiment, description will be made on a semiconductor laser module which uses, for example, a PC (Physical Contact) connector having, as the light feedback portion 16, an emitting end face of an optical fiber, the distal end of which is polished in a spherical shape, or is perpendicularly cut with respect to the longitudinal direction of the fiber.

Figure 12A:
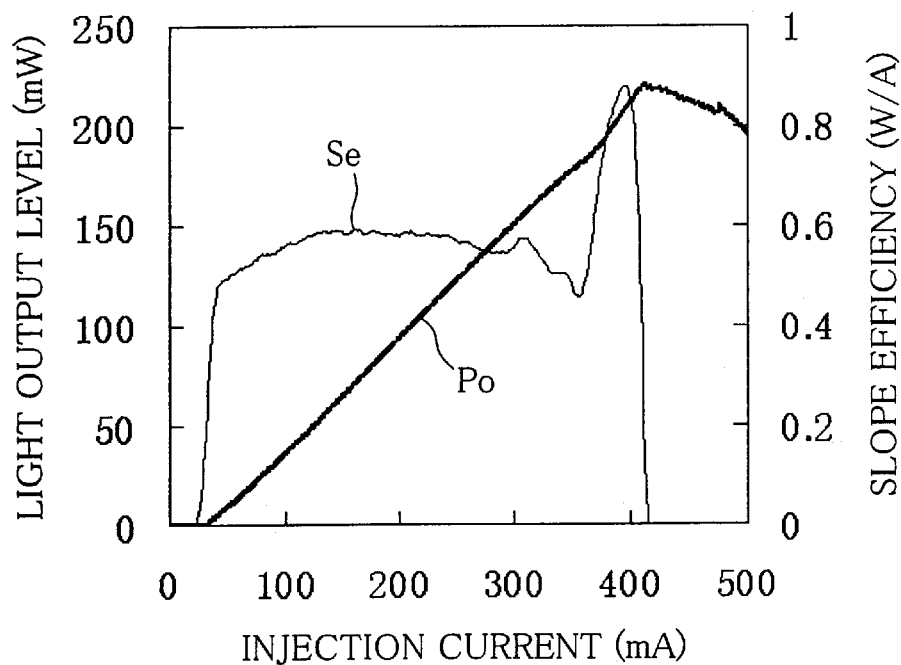
FIGS. 12A and 12B are characteristic graphs related to the semiconductor laser module according to the fourth embodiment of the present invention, with the horizontal axis representing an injection current and the vertical axis representing a current value of output light and a slope efficiency, where
Figure 12B:
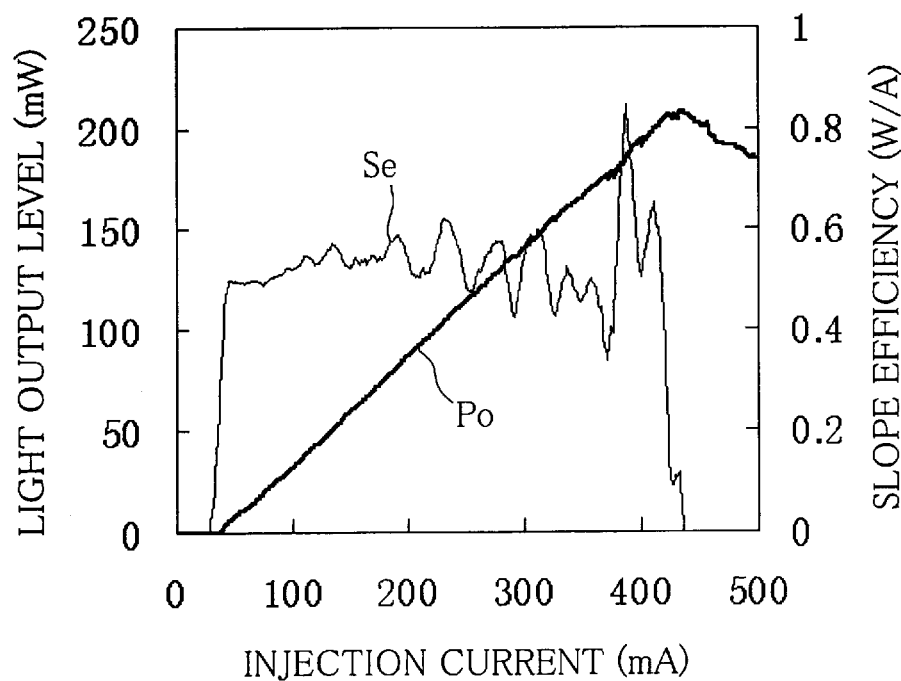

FIGS. 12A and 12B show the current dependences of a light output $P_0$ (mW) and a slope efficiency $S_e$ (W/A) on an injection current (mA) for the semiconductor laser module 25. The FBG 5f used herein as the first light feedback portion exhibits the reflection center wavelength at 979 nm, the reflectance of 7%, and the full width half maximum equal to 1 nm.

FIG. 12A shows the result which is obtained when the above-described PC connector having the light feedback portion 16 with a reflectance of 3%, for example, is used with the semiconductor laser module of the fourth embodiment. FIG. 12B shows the result which is obtained when an APC (Angled Physical Contact) connector having an emitting end face of an optical fiber as a second light feedback portion is used, as a comparative example of the fourth embodiment. The APC connector is an optical connector which has an abutting end face obliquely polished to prevent reflected light from again coupling to the fiber.

As appreciated, since the second light feedback portion in this example has the emitting end face of the optical fiber obliquely polished, the reflectance is significantly reduced to as low as $10^{-6}$%.

It can be seen that the semiconductor laser module employing the APC connector of FIG. 12B exhibits a rather steep slope efficiency and therefore is instable. In contrast, it can be seen that the semiconductor laser module 20 employing the PC connector of FIG. 12A exhibits a gentle slope efficiency and eliminates the instability as observed in FIG. 12B.

It can therefore be confirmed that the semiconductor laser module 25 can stabilize the oscillating state even when it employs the light feedback portion 16 which has a flat reflection level characteristic substantially without the wavelength dependence, and a reflectance lower than a maximum reflectance of the FBG 5f that functions as the first light feedback portion.

Here, when a dielectric multi-layer coating, FBG or any other optical filter is used as the light feedback portion 16, and an APC connecter is used as an optical connector for connecting light passing through such an optical filter to another module or the like, reflection at the optical connector is limited to be lower. Therefore, the semiconductor laser module employing the APC connector is preferred since it can reflect light to the semiconductor laser at a desired reflectance by means of the optical filter.

Here, the semiconductor laser module in the respective embodiments employ the semiconductor laser 6 which outputs light in a wavelength of 980 nm band.

It is known that this type of semiconductor laser 6 suffers from a lower stability over time of the output intensity of the monitor light as compared with those which output light in other wavelength bands.

Therefore, while the present invention can be applied to any semiconductor laser 6 at any wavelength, significant effects result from the application of the present invention to the semiconductor laser module employing the semiconductor laser 6 in a wavelength band centered at 980 nm.

Also, an FBG positioned external to the package 2 means a longer cavity length. This is preferable since the semiconductor laser module can effectively reduce the coherency of the laser oscillation. In the foregoing embodiments, the distance from the rear end facet 6b of the semiconductor laser 6 to the central position of the first light feedback portion in the longitudinal direction along the optical fiber 5 is chosen to be 10 cm or longer.

Further, when the FBG is positioned external to the package 2 as is the case of the foregoing embodiments, the semiconductor laser module may be susceptible to instable laser oscillation due to fluctuations in the refractive index of the optical fiber 5 between the semiconductor laser 6 and the FBG, or the like.

Therefore, the semiconductor laser module is preferably configured to suppress fluctuations in polarization of light by using a birefringent fiber such as a PANDA (polarization-maintaining and absorption-reducing) fiber which has a core applied with a non-axially symmetric stress and a stress applying portion of circular cross-section; a bow-tie fiber of fan-shaped cross-section; an elliptic jacket fiber of elliptic cross-section; an elliptic core fiber having a core waveguide structure in a non-axially symmetric form and a core of elliptic cross-section, as the optical fiber 5 at least between the semiconductor laser 6 and FBG.

While the present invention has been described in connection with its preferred embodiments, the semiconductor laser module of the present invention is not limited to the aforementioned configurations. As an example, the light coupling means is not limited to a wedge-shaped lens of a lensed fiber as long as it can enter laser light emitted from the front end facet 6a of the semiconductor laser 6 into the optical fiber 5 without large connection loss. For example, any appropriate light coupling means may be used such as a hemispherical end of a hemispherically-ended fiber, a lens system using a single lens, and so on.

What is claimed is:

1. A semiconductor laser module, comprising:
   a semiconductor laser having a front end facet from which an output light is emitted;

an optical fiber on which the output light emitted from said semiconductor laser is incident;

a first light feedback portion formed on said optical fiber, said first light feedback portion having a reflection center wavelength and configured to partially reflect the output light with a wavelength substantially equal to the reflection center wavelength toward said semiconductor laser so as to make a wavelength of the output light equal to the reflection center wavelength;

a second light feedback portion formed on said optical fiber and separated from said first light feedback portion, said second light feedback portion configured to partially reflect the output light at a wavelength substantially equal to the reflection center wavelength of said first light feedback portion toward said laser; and a package accommodating said semiconductor laser.

2. The semiconductor laser module according to claim 1, wherein said second light feedback portion is configured to have a reflectance equal to or lower than a maximum reflectance of the first light feedback portion within a wavelength range corresponding to a full width at half maximum of a reflection spectrum of the first light feedback portion.

3. The semiconductor laser module according to claim 2, wherein said second light feedback portion is configured to have a reflection center wavelength substantially equal to the reflection center wavelength of said first light feedback portion.

4. The semiconductor laser module according to claim 3, wherein a difference between the reflection center wavelength of said first light feedback portion and the reflection center wavelength of said second light feedback portion is equal to or less than 2 nm.

5. The semiconductor laser module according to claim 4, wherein the difference is equal to or less than 0.5 nm.

6. The semiconductor laser module according to claim 5, wherein said first light feedback portion comprises:

a fiber bragg grating.

7. The semiconductor laser module according to claim 6, wherein said second light feedback portion comprises:

a fiber bragg grating.

8. The semiconductor laser module according to claim 7, wherein a longitudinal center position of said first light feedback portion and a longitudinal center position of said second light feedback portion are separated by at least 5 mm.

9. The semiconductor laser module according to claim 8, wherein said first light feedback portion and said second light feedback portion are positioned external to the package.

10. The semiconductor laser module according to claim 9, wherein said optical fiber comprises a birefringent fiber configured to substantially prevent a fluctuation in light polarization and disposed between said semiconductor laser and said first and second light feedback portions.

11. The semiconductor laser module according to claim 10, wherein said birefringent fiber comprises at least one of:
a PANDA fiber which has a core applied with a non-axisymmetric stress with a stress applying portion of circular cross-section;
a bow-tie fiber with a stress applying portion of fan-shaped cross section; and
an elliptic core fiber having a non-axisymmetric core waveguide structure with a core of elliptic cross section.

12. The semiconductor laser module according to claim 11, wherein said semiconductor laser comprises a rear end facet, and
said first and second light feedback portions are positioned at least 10 cm away from said rear end facet.

13. The semiconductor laser module according to claim 12, wherein said semiconductor laser is configured to oscillate in a 980 nm wavelength band.

14. The semiconductor laser module according to claim 13, wherein said optical fiber is a lensed fiber, and
said output light is coupled to a distal end of said lensed fiber.

15. The semiconductor laser module according to claim 7, wherein said second light feedback portion comprises:
a plurality of fiber bragg gratings.

16. The semiconductor laser module according to claim 3, wherein a full width at half maximum of a reflection spectrum of said second light feedback portion is greater than said fall width at half maximum of a reflection spectrum of said first light feedback portion.

17. The semiconductor laser module according to claim 3, wherein said first light feedback portion is positioned closer to said semiconductor laser than said second light feedback portion.

18. The semiconductor laser module according to claim 1, wherein said second light feedback portion is configured to have a reflection center wavelength different from the reflection center wavelength of said first light feedback portion.

19. The semiconductor laser module according to claim 18, wherein said first light feedback portion comprises:
a fiber bragg grating.

20. The semiconductor laser module according to claim 19, wherein said second light feedback portion comprises:
a fiber bragg grating.

21. The semiconductor laser module according to claim 20, wherein a longitudinal center position of said first light feedback portion and a longitudinal center position of said second light feedback portion are separated by at least 5 mm.

22. The semiconductor laser module according to claim 21, wherein said first light feedback portion and said second light feedback portion are positioned external to the package.

23. The semiconductor laser module according to claim 22, wherein said optical fiber comprises a birefringent fiber configured to substantially prevent a fluctuation in light polarization and disposed between said semiconductor laser and said first and second light feedback portions.

24. The semiconductor laser module according to claim 23, wherein
said birefringent fiber comprises at least one of:
a PANDA fiber which has a core applied with a non-axisymmetric stress with a stress applying portion of circular cross-section;
a bow-tie fiber with a stress applying portion of fan-shaped cross section; and
an elliptic core fiber having a non-axisymmetric core waveguide structure with a core of elliptic cross section.

25. The semiconductor laser module according to claim 24, wherein
said semiconductor laser comprises a rear end facet, and
said first and second light feedback portions are positioned at least 10 cm away from said rear end facet.

26. The semiconductor laser module according to claim 25, wherein
said semiconductor laser is configured to oscillate in a 980 nm wavelength band.

27. The semiconductor laser module according to claim 26, wherein
said optical fiber is a lensed fiber, and
said output light is coupled to a distal end of said lensed fiber.

28. The semiconductor laser module according to claim 27, wherein
said first light feedback portion is positioned closer to said semiconductor laser than said second light feedback portion.

29. A semiconductor laser module, comprising:
a semiconductor laser having a front end facet from which an output light is emitted;
an optical fiber on which the output light emitted from said semiconductor laser is incident;
a light feedback region formed on said optical fiber configured to reflect light at a predetermined wavelength and comprising
a first light feedback portion having a predetermined reflection center wavelength configured to set an oscillation wavelength of said semiconductor laser, and
at least one second light feedback portion; and a package for accommodating said semiconductor laser, wherein
said at least one second light feedback portion is configured to have a substantially wavelength independent reflection level characteristic and a reflectance lower than a maximum reflectance of said first light feedback portion.

30. The semiconductor laser module according to claim 29, wherein
at least one of said first light feedback portion and said at least one second light feedback portion comprises a fiber bragg grating.

31. The semiconductor laser module according to claim 30, wherein
a longitudinal center position of said first light feedback portion and a longitudinal center position of said at least one second light feedback portion are separated by at least 5 mm.

32. The semiconductor laser module according to claim 31, wherein said light feedback region is positioned external to said package.

33. The semiconductor laser module according to claim 32, wherein
said optical fiber comprises a birefringent fiber disposed between said semiconductor laser and said light feedback region and configured to substantially prevent a fluctuation in light polarization.

34. The semiconductor laser module according to claim 33, wherein said birefringent fiber comprises at least one of:
a PANDA fiber which has a core applied with a non-axisymmetric stress with a stress applying portion of circular cross-section;
a bow-tie fiber with a stress applying portion of fan-shaped cross section; and
an elliptic core fiber having a non-axisymmetric core waveguide structure with a core of elliptic cross section.

35. The semiconductor laser module according to claim 34, wherein
said semiconductor laser comprises a rear end facet, and
said light feedback region is positioned at least 10cm away from said rear end facet.

36. The semiconductor laser module according to claim 35, wherein
said semiconductor laser is configured to oscillate in a 980 nm wavelength band.

37. The semiconductor laser module according to claim 36, wherein
said optical fiber is a lensed fiber, and
said output light is coupled to a distal end of said lensed fiber.

38. The semiconductor laser module according to claim 29, wherein
said first light feedback portion is positioned closer to said semiconductor laser than said at least one second light feedback portion.

* * * * *